(12) United States Patent
Farmer et al.

(10) Patent No.: US 7,377,669 B2
(45) Date of Patent: May 27, 2008

(54) LED MODULE AND SYSTEM OF LED MODULES WITH INTEGRAL BRANCH CONNECTORS

(75) Inventors: Ronald E. Farmer, Houston, TX (US); Christiaan Coenraad Joubert Smit, Houston, TX (US)

(73) Assignee: U.S. LED, Ltd., Houston, TX (US)

( * ) Notice: Subject to any disclaimer, the term of this patent is extended or adjusted under 35 U.S.C. 154(b) by 175 days.

(21) Appl. No.: 11/091,191

(22) Filed: Mar. 28, 2005

(65) Prior Publication Data

US 2006/0215398 A1 Sep. 28, 2006

(51) Int. Cl.
*F21V 21/00* (2006.01)

(52) U.S. Cl. ............... 362/249; 362/800; 362/219; 362/220; 362/238

(58) Field of Classification Search ........ 362/219–220, 362/812, 800, 238, 249, 225, 250; 40/550; 257/88–89; 439/65, 67, 66
See application file for complete search history.

(56) References Cited

U.S. PATENT DOCUMENTS

| | | | |
|---|---|---|---|
| 3,936,686 A | 2/1976 | Moore | |
| 4,143,411 A | 3/1979 | Roberts | |
| 4,612,606 A | 9/1986 | Roberts | |
| 4,720,773 A | 1/1988 | Ahroni | |
| 4,855,882 A | 8/1989 | Boss | |
| 4,908,743 A | 3/1990 | Miller | |
| 5,103,382 A | 4/1992 | Kondo et al. | |
| 5,222,799 A | 6/1993 | Sears et al. | |
| 5,499,170 A | 3/1996 | Gagne | |
| 5,607,227 A | 3/1997 | Yasumoto et al. | |
| 5,697,175 A | 12/1997 | Schwartz | |
| 5,731,794 A | 3/1998 | Miyazawa | |
| 5,746,497 A | 5/1998 | Machida | |
| 6,045,240 A | 4/2000 | Hochstein | |
| 6,048,240 A | 4/2000 | Damsteegt et al. | |
| 6,076,936 A | 6/2000 | George | |
| 6,082,870 A | 7/2000 | George | |
| 6,116,748 A | 9/2000 | George | |
| 6,244,728 B1 | 6/2001 | Cote et al. | |
| 6,350,039 B1 | 2/2002 | Lee | |
| 6,396,466 B1 | 5/2002 | Pross et al. | |
| 6,416,200 B1 | 7/2002 | George | |
| 6,505,956 B1* | 1/2003 | Priddy et al. | 362/248 |
| 6,578,986 B2 | 6/2003 | Swaris et al. | |
| 6,712,486 B1 | 3/2004 | Popovich et al. | |
| 6,793,369 B2* | 9/2004 | Calzaretta et al. | 362/219 |
| 6,932,495 B2* | 8/2005 | Sloan et al. | 362/294 |
| 7,140,751 B2* | 11/2006 | Lin | 362/250 |
| 2001/0015891 A1 | 8/2001 | Suzuki et al. | |
| 2003/0112627 A1* | 6/2003 | Deese | 362/249 |
| 2004/0161953 A1* | 8/2004 | MacLaren et al. | 439/65 |

OTHER PUBLICATIONS

Luxeon, AB10 Luxeon® Emitter Assembly Information—Application Brief, 12 pages, (2001).

(Continued)

*Primary Examiner*—Jong-Suk (James) Lee
*Assistant Examiner*—Robert May
(74) *Attorney, Agent, or Firm*—Akin Gump Strauss Hauer & Feld, LLP

(57) ABSTRACT

An LED module provides one or more LEDs mounted in a circuit board assembly, which circuit board assembly includes first and second conductive areas located at each end of the circuit board assembly to attach to electrical connectors mounted on branch wiring to extend to branch LED modules.

11 Claims, 3 Drawing Sheets

OTHER PUBLICATIONS

A. Wong, *Subminiature InGaN Blue Lamps HLMP-PB00 HLMP-QB00*, Hewlett Packard, 2 pages, (Aug. 1998).
*Subminiature High Performance AlInGaP LED Lamps*, Technical Data, Hewlett Parkard, 2 pages.
*Super Flux LEDs*, Technical Data, Hewlett Packard, 2 pages.
*Thermal Management Considerations for Super Flux LEDs*, Application Note 1149-4, Hewlett Packard, pp. 1-6 (Sep. 2000).

*ChanneLED4 Constant Current The LED Alternative to Neon Channel Letter Lighting*, SloanLED, http://www.sloanled.com/ChanneLED4.html, 2 pages, (Apr. 14, 2004).
*ChanneLED4 Constant Current and 12VDC Power Supplies Installation Guide*, SloanLED, 8 pages, (Oct. 2003).

\* cited by examiner

LED MODULE AND SYSTEM OF LED MODULES WITH INTEGRAL BRANCH CONNECTORS

CROSS-REFERENCE TO RELATED APPLICATIONS

None.

BACKGROUND OF THE INVENTION

1. Field of the Invention

The invention relates generally to the field of lighting systems utilizing light emitting diodes ("LEDs") to provide lighting effects or signage, and to the installation of LED modules in signage or the like.

2. Description of the Related Art

Luminescent lighting displays, such as cabinet and flat panel signs, billboards, storefront awnings, and the like, often utilize illuminated signage fixtures commonly referred to as "channel letters" to produce a variety of lighting effects. Such channel letters typically comprise one or more channels, with internal light sources, each channel being shaped as a letter, number, design, or a combination thereof, and each generally having a rigid, translucent plastic cover. The term "lighting displays" also includes architectural lighting, interior lighting for homes and businesses, and other applications where it is desirable to provide evenly bright, long-lasting lighting with low-power requirements.

The common light sources, such as fluorescent lamps, halogen lamps, gaseous discharge xenon lamps, neon lights, and the like, have been used in such lighting displays and fixtures, such as channel letters, for illuminated signs. These types of light sources typically convert a significant portion of the power or energy consumed into heat that may be difficult to dissipate from a sealed display, and may damage electronic circuitry contained therein. In addition, these lamps consume significant amounts of power, and typically require large power supplies or transformers. Some of these lamps and power supplies also generate substantial electromagnetic emissions, which may interfere with radio communications and thus can be problematic in certain applications and locations. Finally, these light sources may have a relatively short operational life, necessitating frequent replacement.

As a result of these known problems with traditional lighting sources, there are many potential areas of application in luminescent lighting displays for light emitting diodes ("LEDs"). This is because LED systems, among other advantages, enable creation of a lighting display that: (1) is far more durable than present sources in common use; (2) is modular and, therefore, more adaptable; (3) has a long life span; (4) is portable; (5) operates in damp conditions; (6) uses lower voltage, producing a light display that is much safer to use, install, service and less expensive to operate; and (7) is more durable than glass-based lamps.

In order to install LED modules in signage such as channel letters, it is necessary to attach the LEDs in a main string wherein each LED module is electrically connected in parallel to adjacent LED modules so that the voltage or electric potential across each LED module is constant. But, in order to complete certain signage such as certain letters, it is necessary to create branch strings of LED modules. For example, in order to install the letter "T", the top line of the T can be formed as part of a main string of LED modules; but, a branch from the main string must be connected to and extend from the main string to make the vertical base.

A known method to install branch segments or strings of LED modules is to use IDC connectors. In order to branch off of a main string of known LED modules, an IDC connector is snapped onto each of the two wire leads which electrically connect adjacent LED modules such that the wire leads remain connected to the adjacent LED modules, but, a branch lead extends out of each IDC to attach to the first LED module of the branch string. Such branch connections can be made by other means, but insofar as known, it has been necessary to tap into each of the two LED module wire leads in the main string in order to install a branch line or segment. Using such known branch connector IDCs, while workable to make branch connections, can be time consuming, particularly when short wire leads are used to interconnect a group of LEDs in a dispensing reel of LED modules.

BRIEF SUMMARY OF THE INVENTION

An LED modular system is provided which includes a plurality of LED modules interconnected into a main string wherein at least one of the LED modules includes protruding connector tabs which allow for connection of a branch string to that module. The LED module is provided for mounting and powering one or more LEDs and comprises an LED circuit board assembly comprised of multiple layers including first and second conductive portions to be powered at different electrical potentials. One or more LEDs are electrically connected to each of the first and second conductive portions of the circuit board assembly. Each conductive portion includes first and second conductive areas for electrical connection to wire leads or connectors for electrically connecting the LED module to adjacently positioned LED modules to form a main string of LED modules. Each of the conductive portions of the circuit board assembly further includes a third conductive area which in one embodiment protrudes or extends from the circuit board assembly in order to be electrically connected to a branch wire assembly extending to an LED module to form a branch string of LED modules.

The series of LED modules are assembled into a main string mounted on a reel or other dispenser so that the installer can utilize the main string of interconnected LED modules as the main string of a lighting or sign display by installing the main string into signage such as channel letters. The installer can create a branch string simply by attaching wire connectors of wire assemblies onto the protruding third areas or pads within the conductive portions and by attaching the other end of the wire assemblies to a similar LED module forming the first (or other) LED module in a branch string. Various branch strings can be created off of the main string of LED modules utilizing the branch connector systems of LED modules of this invention.

These and other objects are provided, in accordance with the invention, by an LED module comprising one or more LEDs mounted in a circuit board assembly, with a power supply operably connected to the circuit board assembly to power the LEDs. Each LED is mounted on the circuit board assembly, and a current source is provided through a suitable power supply to drive the LEDs. Each LED module contains wire connections to other LED modules which can be used to supply power from module to module in a main string of LED modules. The circuit board assembly which mounts the LEDs to form the LED module includes first and second tabs or areas which are attachable through connectors to another LED module to power a branch string of LED modules.

DETAILED DESCRIPTION OF THE INVENTION

The LED module system of the present invention is, in one embodiment, a lighting system that can be used to replace neon in electric sign applications, among other uses. The system consists of one or more LED modules as a light source, each module containing one or more LEDs that may be of any color.

As used herein, the term "LED" is intended to refer generally to light emitting diodes of all types, but also should be understood to include any kind of similar system that is capable of receiving an electrical potential and producing a color of visible or ultraviolet (UV) light in response to the resulting electrical current. Thus, the intent is to include such systems as light emitting diodes, semi-conductor dies that produce light in response to current, organic LEDs, electro-luminescent strips, silicon based structures that emit light, and other such systems within the term "LED."

In specific discussions of an embodiment herein, the term "LED" may also refer to a single light emitting diode package having multiple semiconductor diodes that are individually controlled. It should also be understood that the term "LED" is not restricted to the package type of LED. The term "LED" includes packaged LEDs, non-packaged LEDs, surface mounted LEDs, chip mounted on board LEDs and LEDs of all other configurations. The term "LED" also includes LEDs packaged or associated with phosphor wherein the phosphor may convert energy from the LED to a different wavelength.

The term "illuminate" should be understood to refer to the production of a frequency of radiation by an illumination source with the intent to illuminate a space, environment, material, object, or other subject. The term "color" should be understood to refer not only to any frequency of radiation, or combination of different frequencies, within the visible light or ultraviolet spectrum. The use of any specific color is exemplary and illustrative only, and any other color or combination of colors can be used. The use of any specific color name does not imply a particular frequency of light.

Figure 1:
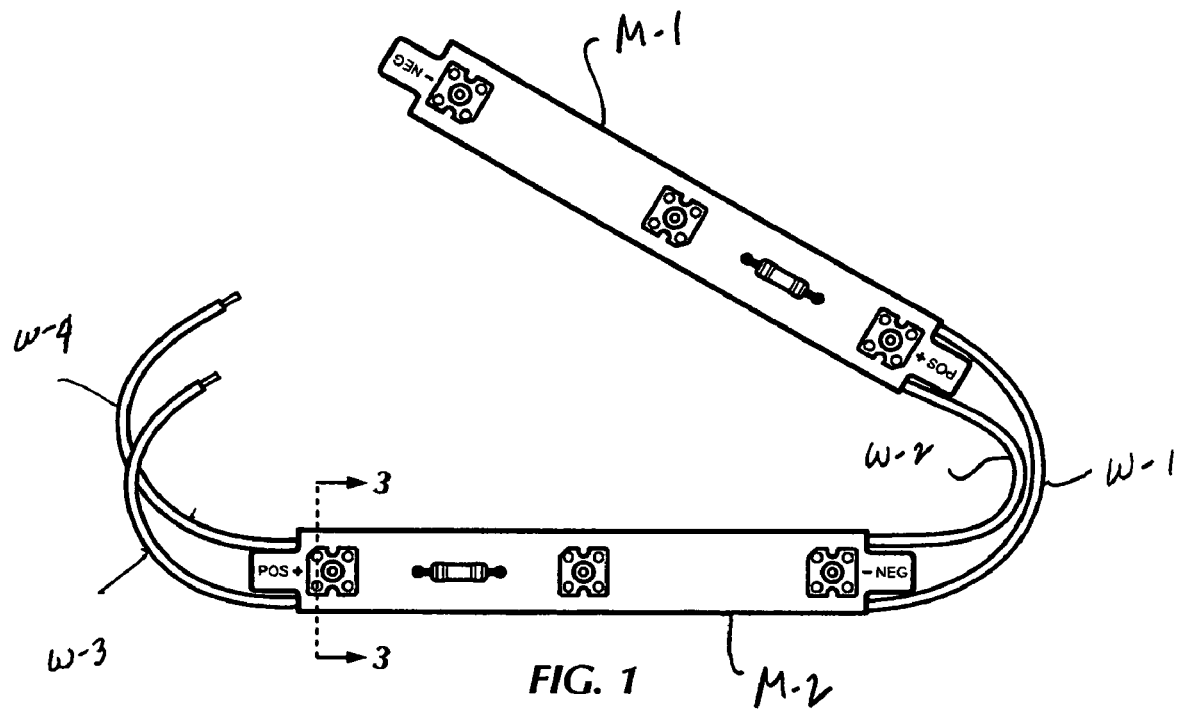
FIG. 1 is a perspective view of two interconnected LED modules displaying patentable features of this invention.
Figure 3:
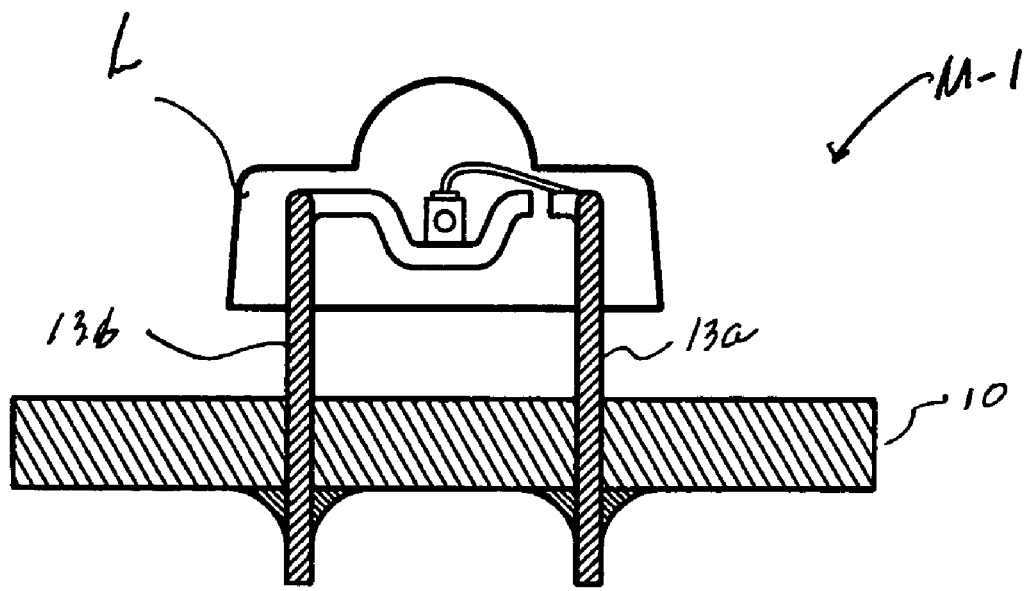
FIG. 3 is a general sectional view of the circuit board assembly of the LED module taken along line 3-3 of FIG. 1.

Referring to the drawings and in particular to FIG. 1, two LED modules, M1 and M2 are illustrated as interconnected by wires W1 and W2. The LED modules M1 and M2 as interconnected can form part of a main string or a branch string of interconnected LED modules in order to provide lighting for signage or other displays. While the LED modules such as M1 and M2 are physically attached in series to form strings, the electrical connection from module to module is actually in parallel. Referring now to FIG. 3, the LED modules such as M1 include a circuit board assembly 10 which mounts one or more LEDs generally designated as L onto the circuit board assembly. While the circuit board assembly is illustrated in section as a solid member, it is known to those skilled in the art that such circuit board assemblies are actually made up of layers of various materials.

Figure 2:
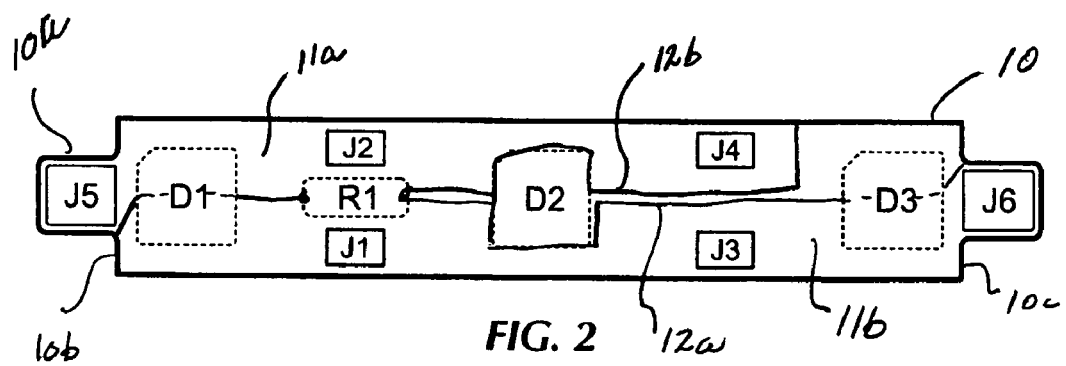
FIG. 2 is a bottom view of an LED module illustrating the end protrusions or tabs which allow for quick and easy installation of a branch connection.

The circuit board assembly 10 therefore actually includes a plurality of layers. Describing from the top of the circuit board assembly 10 downwardly, immediately below the LEDs L is a silk screen layer which includes identifying manufacturer information. Below the silk screen layer is an insulating layer of fiberglass, and below the fiberglass layer is a copper conductive layer, and below the copper layer is a solder mask layer. The etchings in the copper layer divided the circuit board assembly 10 into two conductive portions generally designated as 11a and 11b as shown in FIG. 2, which is a bottom view of the circuit board assembly 10. Thus, etchings in the copper layer, which are represented by the series of lines such as 12a and 12b, effectively electrically isolate the first and second conductor portions 11a and 11b such that each portion is of a different electrical potential. In this manner, LEDs D1, D2 and D3 in FIG. 2 are connected by LED posts such as 13a and 13b to each of the two conductive portions 11a and 11b at different electrical potential so that upon that application of current, the LEDs, the D1, D2 and D3 are driven to illumination. Below the conductive layer is another solder mask layer which electrically insulates all but the exposed conductive areas to be described.

Referring to FIGS. 1 and 2, the conductive portion 11a includes first and second exposed conductive areas J2 and J4 for electrical connection to interconnecting wires W4 and W2, respectively, which are soldered to the conductive pads or areas J2 and J4.

Similarly, the second conductive portion 11b includes conductive areas or exposed pads J1 and J3 which are electrically connected to interconnecting wires W3 and W1 which are soldered to areas J1 and J3 in a known manner. As is known in the art of the construction of LED modules, the circuit board 10 mounts 3 LEDs D1, D2 and D3. The number of LEDs mounted on each circuit board assembly 10 of each LED module such as M1 may vary from one to three or more. Again, as known in the art, LED modules such as M1 and M2 can be connected together into a string of LEDs which can be wound onto a reel or other dispenser (not shown) so that an installer can unwind and mount the string of LED modules onto a channel sign (such as shown in FIG. 5) or other display.

Referring again to FIG. 2, the first conductive portion 11a further includes a tab or area of protrusion 10a located at end 10b of the circuit board assembly 10. The tab or protrusion 10a is generally rectangular and extends outwardly from end 10b of a circuit board assembly. The underside of the tab 10a includes a third conductive area J5 which is formed as part of the copper conductive layer in which the conductive areas J2 and J4 are also located. The conductive area J5 is surrounded within the tab or protruded portion by bottom layer of solder mask as well as a layer of silk screen. Within the conductive portion 11b, a tab or protruding area J6 of similar construction to tab J5 is positioned on end 10c of the circuit board assembly, but tab J6 is formed in the copper conductor layer that forms the exposed conductive areas J1 and J3. In this manner, conductive areas J2, J4 and J5 are at the same electrical potential and, conductive areas J1, J3 and J6 are at a different electrical potential, with the LEDs D1, D2 and D3 (which are connected in series) are all connected to the first and second conductive portions 11a and 11b such that upon application of power to each conductive portion, the LEDs are driven to illumination.

A main string of LED modules such as M1 and M2 are interconnected by wires W1 and W2, which are soldered to the areas J3 and J4, so that a main string of LEDs can be formed and wound onto a reel or otherwise utilized. Similarly, wires W3 and W4 are soldered to conductive areas J1 and J2, or J3 and J4, respectively, in order to be attached to an adjacent LED module, which may be of the construction of modules M1 and M2, or of another construction, such as without the branch connector tabs having exposed conductive areas J5 and J6.

Figure 5:
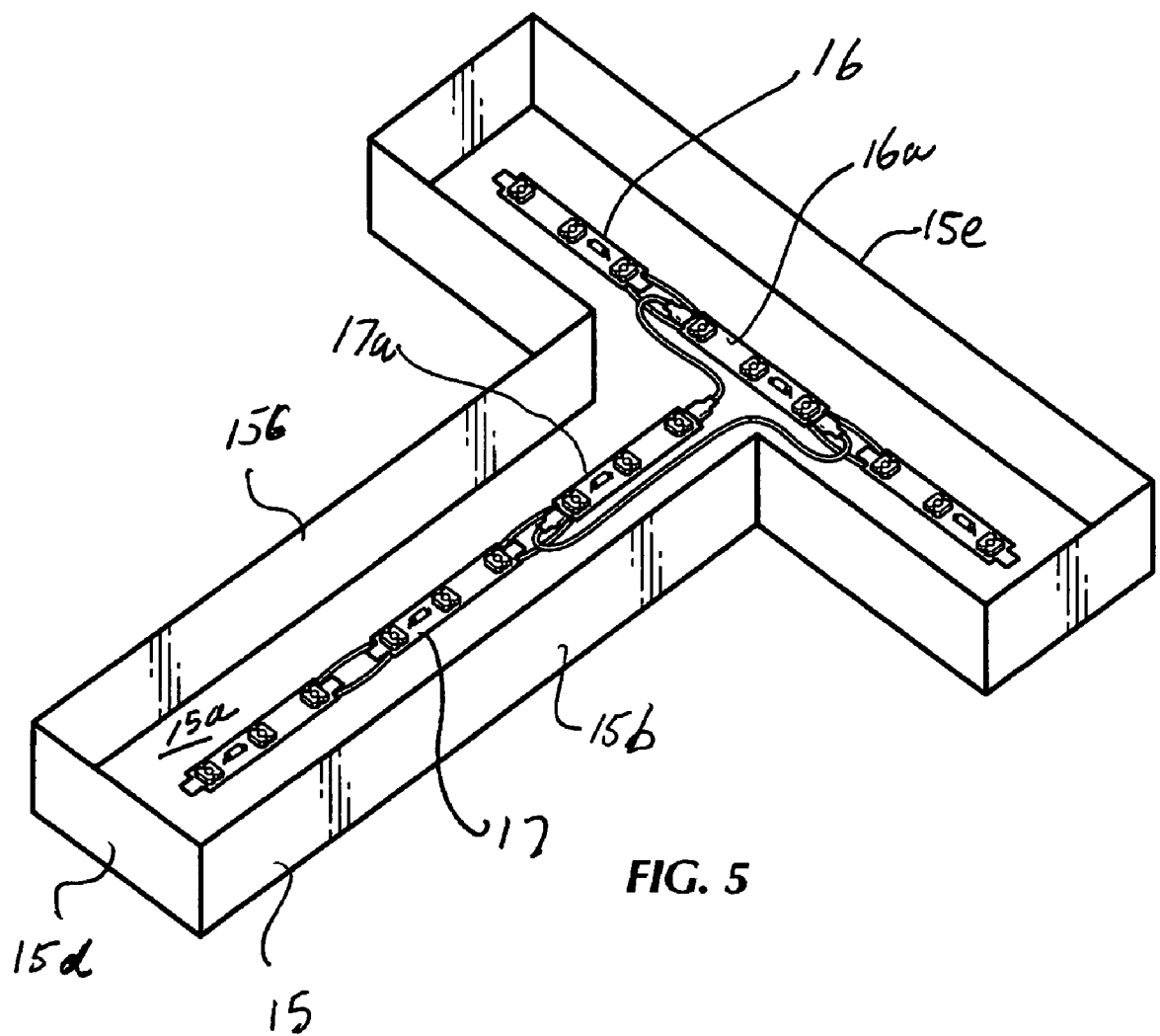
FIG. 5 is a perspective view of a channel sign letter "T" wherein a main string as well as a branch string of LED modules has been installed.

Referring to FIG. 5, a channel sign 15 is shown. Typically, the channel sign 15 is structured to house a series of LED modules in the configuration of the channel sign in order to depict a particular shape, here the letter "T." The channel sign 15 may be made of aluminum or other material and includes a bottom 15a having sides 15b and 15c extending outwardly from the bottom 15a as well as end portions 15d and 15e. Any type of cover can be put on top of the sign, such as a plastic cover of a particular color such that the enclosed LEDs mounted inside the channel letter T illuminate a particular color. Or, the LEDs themselves may provide a desired color with the cover being clear.

In mounting a series of LED modules within the channel sign T, it should be understood that the letter T is only one of a group of letters which may form a sign. Therefore, in a typical installation, the upper part of the T designated as 16 as shown in FIG. 5 would actually be interconnected with a group of interconnected LED modules which form a main string as dispensed from a reel and powered by a single power source (or multiple as necessary and as known in the art). The main string of LED modules illustrated as 16 in FIG. 5 is therefore formed of interconnected LED modules such as M1 and M2 illustrated in FIG. 1. Each LED module such as M1 and M2 may be attached to a clip or stand-off, preferably made of a non-heat conductive material for attachment directly to the bottom 15a of the channel sign using attaching systems such as adhesives, tapes, screws or the like.

Figure 4:
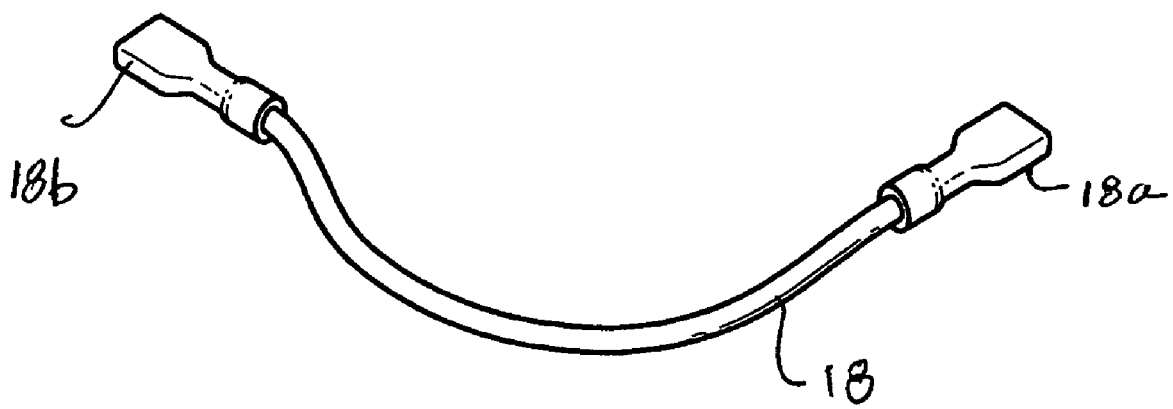
FIG. 4 is a typical wire assembly or lead which can be utilized to connect to an LED module of FIGS. 1 and 2 in a main string in order to form a branch string of LED modules.

When it is necessary to install a branch line such as to form the base 17 of the T shown in FIG. 5, all that is necessary is that branch wire assemblies or leads 18 having insulated quick connectors 18a and 18b (as illustrated in FIG. 4) be attached to the tabs J5 and J6 of LED module 16a and extend downwardly to connect in electrical parallel to tabs on LED 17a, the first LED module in the branch of LED modules forming the base of the T. In this manner, simple wire connectors or leads 18 can be simply installed onto the end tabs of an LED module 16a and then connected to similar end tabs on an LED module 17a to begin the construction of the branch string or base of the T, making it unnecessary to connect branch wiring to the actual interconnecting wires in the main string of LEDs. This invention thus provides a quick and easy way for installers to make branch connections off of a main string of LEDs, and additional branch connections off of a first branch connection, if necessary. While connectors 18 of FIG. 4 can be used, it should be understood that the branch electrical connections from the first and second conductive portions 11a and 11b can be made by any other suitable electrical connection.

While the illustration in FIG. 5 is of a channel sign letter T, it should be understood that the concept of this invention applies to any signage or displays, which can be located inside or outside of buildings or other structures.

The LED module systems of this invention are driven by typical power sources, and thus it is understood that the interconnection of LEDs in the main string, while physically connected by wire such as W1 and W2 serially in a string, the actual electrical connection is in parallel with the electrical potential across each of the first and second conductive portions of each LED being in parallel. Similarly, the wire assemblies 18 or other wire connectors that extend from the LED module 16a in the main string to the LED module 17a in the branch string to form the letter T are attached in parallel.

While certain exemplary embodiments have been described in detail and shown in the accompanying drawings, it is to be understood that such embodiments are merely preferred and only illustrative of and not restrictive of the broad invention. Other and further embodiments of the invention may be devised without departing from the basic scope thereof, which is determined by the claims that follow. By way of example, and not limitation, the specific electrical components utilized may be replaced by known equivalents or other arrangements of components which function similarly and provide substantially the same result. The type and number of wire leads or connectors may vary with the application. The source of power may be adjusted or modified in accordance with local electrical installation regulations or for other reasons without deviating from the principles of this invention, and other similar changes can be made by persons of ordinary skill in this art without deviating from the principles of this invention.

We claim:

1. An LED module for mounting and powering one or more LEDs for use in lighting displays, comprising:
    an LED circuit board assembly comprising:
        an LED;
        a generally rectangular circuit board having a first and a second longitudinal end portion, comprising:
            a first conductive area, electrically connected to the LED, and electrically connected to a second LED module;
            a second conductive area, electrically connected to the LED, and electrically connected to a third LED module; and
            a first male connector and a second male connector, each formed as a portion of the circuit board and extending outwardly and coplanarly from one of the first and second longitudinal edge portions of the circuit board in a configuration adapted to physically and electrically connect to a fourth LED module.

2. The LED module set forth in claim 1, further comprising:
    a first branch wire assembly for connection to the first male connector; and
    a second branch wire assembly for connection to the second male connector.

3. The LED module set forth in claim 2, wherein the LED module, the second LED module, and the third LED module, when electrically connected, form a main string of LED modules, and
    wherein the first and second branch wire assemblies when in electrical connection with the fourth LED module form a branch string of LED modules extending from the LED module in the main string of LED modules.

4. The LED module set forth in claim 1, wherein:
    the first male connector comprises:
        a first protruding tab adapted to receive a first female electrical connector; and the second male connector comprises:
a second protruding tab adapted to receive a second female electrical connector,
wherein the first protruding tab and the second protruding tab are positioned at opposite ends of the LED circuit board assembly.

5. The LED module of claim 1, further comprising:
a branch wire assembly, comprising:
a wire; and
a pair of female quick connectors, attached to opposite ends of the wire, each configured for attachment to the one of the first and second male connectors for connecting the LED module and the fourth LED module.

6. A plurality of LEDs for use in creating a sign or other display, comprising:
a dispenser which mounts a plurality of LED modules which are interconnected into a dispensing string wherein each LED module includes:
an LED circuit board assembly comprising:
an LED;
a generally rectangular circuit board having a first and a second longitudinal end portion, comprising:
a first conductive area, electrically connected to the LED, and electrically connected to a second LED module in the dispensing string;
a second conductive area, electrically connected to the LED, and electrically connected to a third LED module in the dispensing string; and
a first male connector and a second male connector, each of formed as a portion of the circuit board and extending outwardly and coplanarly from one of the first and second longitudinal edge portions of the circuit board in a configuration adapted to physically and electrically connect to the fourth LED module.

7. The plurality of LEDs of claim 6, further comprising:
a pair of branch wire assemblies, each comprising:
a wire; and
a pair of female quick connectors, attached to opposite ends of the wire, each configured for attachment to one of the first male connector and the second male connector,
wherein each of the pair of branch wire assemblies is connectable to one of the first male connector and the second male connector.

8. An LED module for mounting and powering one or more LEDs for use in lighting displays, comprising:
an LED circuit board assembly comprising:
an LED;
a generally rectangular circuit board having a first and a second longitudinal end portion, comprising:
a first conductive area, electrically connected to the LED, and electrically connected to a second LED module;
a second conductive area, electrically connected to the LED, and electrically connected to a third LED module; and
a first male connector and a second male connector, each formed as a portion of the circuit board and extending outwardly and coplanarly from one of the first and second longitudinal edge portions of the circuit board,
wherein the LED module, the second LED module, and the third LED module when electrically connected form a main string of LED modules; and
wherein the fourth LED module when electrically connected to the LED module branches from the main string of LED modules.

9. A plurality of LEDs mounted on a reel for use in creating a sign or other display comprising:
a dispenser which mounts a plurality of LED modules which are interconnected into a dispensing string wherein each LED module includes:
an LED circuit board assembly comprising:
an LED;
a generally rectangular circuit board having a first and a second longitudinal end portion, comprising:
a first conductive area, electrically connected to the LED, electrically connecting the LED circuit board assembly to a second LED module in the dispensing string;
a second conductive area, electrically connected to the LED, electrically connecting the LED circuit board assembly to a third LED module in the dispensing string; and
a first male connector and a second male connector, each formed as a portion of the circuit board and extending outwardly and coplanarly from one of the first and second longitudinal edge portions of the circuit board in a configuration adapted to physically and electrically connect to the fourth LED module,
wherein the LED module, the second LED module, and the third LED module form a main string of LED modules, and
wherein the fourth LED module forms a branch string when electrically connected to the main string of LED modules.

10. The plurality of LEDs of claim 9, further comprising:
a pair of branch wire assemblies, each comprising:
a wire; and
a pair of female quick connectors, attached to opposite ends of the wire, each configured for attachment to one of the first male connector and the second male connector,
wherein each of the pair of branch wire assemblies is connectable to one of the first male connector and the second male connector of the third conductive area.

11. The plurality of LEDs of claim 9, the LED circuit board assembly further comprising:
a first pair of wires, affixed to the first conductive area and to the second LED module in the dispensing string; and
a second pair of wires, affixed to the second conductive area and to the third LED module in the dispensing string.

* * * * *